United States Patent [19]

Sprague

[11] Patent Number: 4,852,168

[45] Date of Patent: Jul. 25, 1989

[54] COMPRESSION OF STORED WAVEFORMS FOR ARTIFICIAL SPEECH

[76] Inventor: Richard P. Sprague, 5631 Marilyn Cir., Westminster, Calif. 92683

[21] Appl. No.: 932,165

[22] Filed: Nov. 18, 1986

[51] Int. Cl.$^4$ .............................................. G10L 3/02
[52] U.S. Cl. ....................................... 381/35; 381/34; 381/52; 341/59; 341/65
[58] Field of Search ...................... 381/31, 34, 35, 52, 381/36–40, 51, 53; 358/260, 261; 365/45; 340/347; 341/50, 59, 65; 364/513.5

[56] References Cited

U.S. PATENT DOCUMENTS

| | | | |
|---|---|---|---|
| 4,396,906 | 11/1980 | Weaver | 340/347 DD |
| 4,617,645 | 10/1986 | Sprague | 365/45 |
| 4,692,941 | 9/1987 | Jacks et al. | 381/52 |
| 4,718,087 | 1/1988 | Papamichalis | 381/34 |
| 4,720,861 | 1/1988 | Bertrand | 381/36 |

*Primary Examiner*—William M. Shoop, Jr.
*Assistant Examiner*—Brian Young

[57] ABSTRACT

In a digital text-to-speech conversion system of the type usually contained in all-software form on a floppy disk, memory requirements are reduced while speech quality is improved, by providing compression techniques and anti-distortion techniques which interact to provide clear speech at widely varying speeds with a minimum of memory. These techniques include using Huffman coding to advantage by encoding only differences between successive waveforms where feasible, relocating delta tables and using them repetitively, using a demi-diphone organization of the speech to allow use of the same instruction lists for several sounds; and combining selective deletion or repetition of waveforms with selective interpolation to vary speed without slurring.

16 Claims, 9 Drawing Sheets

| Silence to r | r | r to IH | IH | IH to t | t | t to SH | SH | SH to ER | ER | ER to silence |
|---|---|---|---|---|---|---|---|---|---|---|

FIG. 9b

| Silence to r | r to IH | IH to t | t to SH | SH to ER | ER to silence |
|---|---|---|---|---|---|

FIG. 9c

| Left silence to r | Right silence to r | Left r to IH | Right r to IH | Left IH to t | Right IH to t | Left t to SH | Right t to SH | Left SH to ER | Right SH to ER | Left ER to silence | Right ER to silence |
|---|---|---|---|---|---|---|---|---|---|---|---|

COMPRESSION OF STORED WAVEFORMS FOR ARTIFICIAL SPEECH

FIELD OF THE INVENTION

This invention relates to the compression of digitized waveforms, and more particularly to the reduction of storage requirements for speech elements in software used in the production of artificial speech.

BACKGROUND OF THE INVENTION

Copending application Ser. No. 598,892 filed 10 Apr. 1984 and entitled "Real-Time Text-to-Speech Conversion System" discloses a text-to-speech conversion system in which digitized waveforms representing constituents of speech are stored in a random access memory, and are assembled into phonemes and transitions under the control of a program which reads computer-formatted text and determines therefrom which stored waveforms are to be used, and in what manner, to create spoken words corresponding to the text.

A major problem in using all-software text-to-speech conversion programs in personal computers is the inadequacy of available memory for high-quality speech production. Consequently, it is necessary to compact the stored waveforms so that a great deal of waveform data can be stored in a small amount of random access memory. Some compaction methods suitable for this purpose are described in the aforesaid application Ser. No. 598,892 and another is described in my U.S. Pat. No. 4,617,645.

Although these methods were satisfactory in early text-to-speech conversion products, the continuing need for ever more natural-sounding artificial speech has made it necessary to develop more powerful compression methods in order not only to store more digitized waveforms within the limits of available memory, but also to reduce the amount of program memory involved in assembling the stored waveforms to produce speech.

SUMMARY OF THE INVENTION

The present invention achieves considerably improved compaction by combining a number of novel compaction methods in the storage, retrieval, and processing of digitized waveforms to produce speech.

To begin with, in accordance with the invention, the number of digits in the delta table which is used in defining each waveform in accordance with the teachings of U.S. Pat. No. 4,617,645 is reduced by the use of Huffman coding.

Secondly, a substantial amount of memory is saved by storing, for successive pitch periods of vowels, not the actual waveform for each pitch period but the difference between the waveform for a given pitch period and the waveform for the preceding pitch period. Because the differences between such waveforms is quite small, Huffman coding is particularly effective in this situation.

Thirdly, a single delta table is used with several waveforms, thereby greatly alleviating the problem of storage of duplicate delta tables.

Fourthly, placement of the delta table at the end of the indicia list in each stored waveform rather than at its beginning reduces the storage requirement for any waveform which can be reproduced exactly with 128 or less delta values rather than the conventional 256.

Fifthly, to the extent that speech quality considerations permit, some audio waveforms are substituted for others with similar spectrum information. By the use of such substitutions, the total number of stored waveforms is reduced without seriously affecting speech quality.

Sixthly, storage of silence periods in waveforms is reduced by merely storing a number indicating the number of zero-amplitude samples to be used.

Seventhly, the need for program memory is substantially reduced by breaking each diphone of the speech into left and right demi-diphones. Although this would appear at first glance to require the storage, in the program, of twice as many waveform processing instructions, so many demi-diphones have been found to be interchangeable with one another that the total program storage requirement for demi-diphones is substantially less than for diphones.

Eighthly, the need for storage of fricative waveforms is reduced by interpolation and progressive truncation of a basic fricative waveform to produce, with only two short stored waveforms, a very close approximation of a complex natural fricative sound.

Ninthly, the harmonic distortion caused by the concatenation of waveform segments (as in the compression technique of using consecutive repetitions of a short component waveform to produce a single sound) whose initial and final amplitudes do not match is greatly reduced by ramping the initial or terminal portion of each waveform to produce an amplitude match with the next waveform at their interface.

Tenthly, the speed of the speech is controlled by the selective addition or deletion of repeats of waveform segments, coupled with a variation of the interpolation contour.

It is the primary object of the invention to produce an improved speech quality in digital text-to-speech conversion systems while reducing the need for random-access memory in the system.

It is another object of the invention to achieve improved compaction of waveforms digitally stored by a linear prediction coefficient method by a novel organization of the stored information, by the multiple use of some of the stored information, by the use of Huffman coding, by storing waveform differences rather than waveforms, and by substituting waveforms for other waveforms with similar spectrum information.

It is a further object of the invention to achieve additional economies in waveform storage by controlling the speed of speech delivery through variations in the number of waveform segment repetitions, and by numerically encoding periods of silence.

It is still another object of the invention to reduce the program memory requirements in a text-to-speech conversion system of the type described, by operating on demi-diphones instead of diphones.

It is a still further object of the invention to improve the quality of artificial speech generated from compressed digitized waveforms by using interpolation and progressive truncation for producing a more natural approximation of fricatives, and by using ramping techniques to minimize the harmonic distortion produced by the concatenation of non-matching waveform segments.

BRIEF DESCRIPTION OF THE DRAWINGS

FIG. 6b is a time-amplitude diagram showing the waveform representing the difference between the two waveforms of FIG. 6a;

FIG. 13b is a flow chart illustrating the decision-making program for the system of FIG. 13a;

FIG. 14a is a block diagram for an adjustable recursive interpolation scheme for use in the system of FIG. 13a;

FIG. 14b is a diagram illustrating the effect of varying the recursion factor in the scheme of FIG. 14a;

FIG. 14c is a time-frequency diagram illustrating the interpolation of format frequencies by the scheme of FIG. 14a;

FIG. 15 is a diagram illustrating the effect of various deletion or repetition rates in the system of FIG. 13a; and FIG. 16 is a diagram illustrating a method of obtaining intermediate interpolation rates in the scheme of FIG. 14a by varying the repetition rate in the system of FIG. 13a.

DESCRIPTION OF THE PREFERRED EMBODIMENT

Introduction

Figure 1:
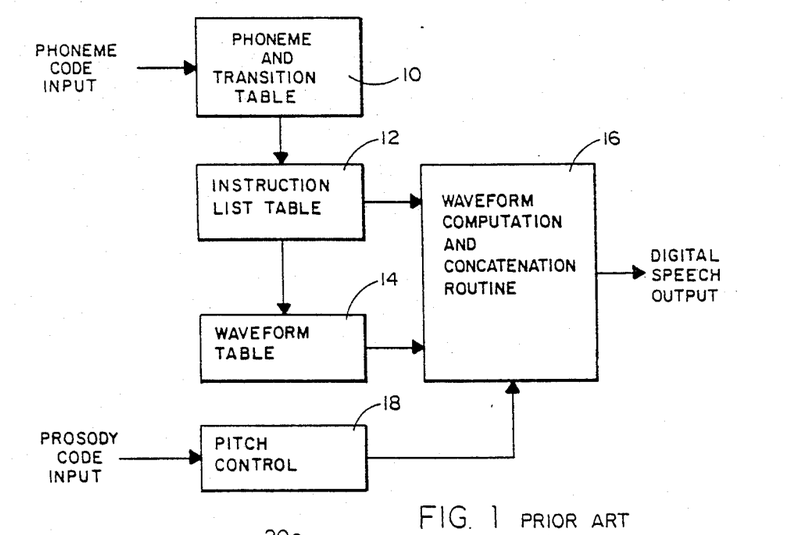
FIG. 1 is a block diagram of the portion of the system of copending application Ser. No. 598,892 which is relevant to the present invention.
Figure 2:
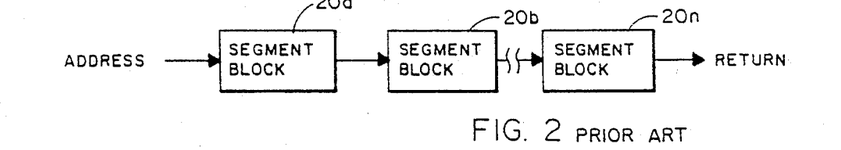
FIG. 2 is a detail block diagram of the instruction list table of FIG. 1.
Figure 3:
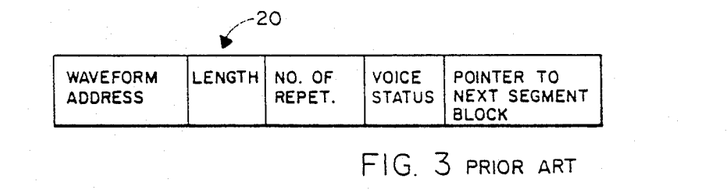
FIG. 3 is a detail block diagram of a typical segment block of FIG. 2.

FIGS. 1 through 3 illustrate, in general outline, the speech generation portion of the text-to-speech conversion system of copending application Ser. No. 598,892, which the present invention improves.

Information regarding what speech sounds to generate, and at what pitch, is supplied to the system of FIG. 1 in the form of a sequence of phoneme codes and corresponding prosody codes. The phoneme codes are applied to a phoneme and transition table 10 which selects an appropriate instruction list from the instruction list table 12 to produce a given phoneme or transition. The instruction list in turn selects appropriate digitized waveforms from the waveform table 14 and feeds them to the waveform computation and concatenation routine 16 which produces a continuous digital sample stream under the control of the instruction list and the pitch control 18, which is in turn controlled by the prosody codes. This sample stream is the digital speech output which can be converted to audible speech by a digital-to-analog converter or by other techniques not material to this invention.

As shown in FIG. 2, each instruction list consists of a series of segment blocks 20a through 20n. The first segment block 20a is addressed by the phoneme and transition table 10, and the last segment block 20n returns control to the phoneme and transition table 10 for the generation of the next phoneme or transition.

In the system of Ser. No. 598,892, each segment block 20 contained five pieces of information: (1) the address of a specific waveform in the waveform table 14; (2) the length of that waveform (i.e. the number of digitally encoded samples defining it); (3) the number of successive repetitions of that waveform to be generated; (4) the voice status (i.e. whether the phoneme being generated was voiced or unvoiced); and (5) the address of the next segment in the list (or in the last segment 20c, a return instruction).

Figure 4:
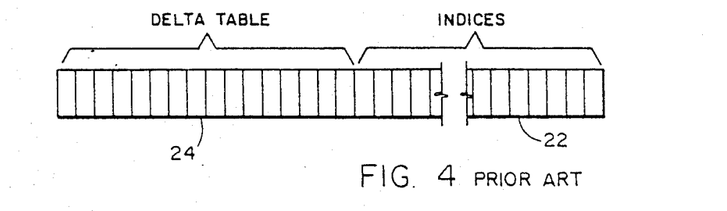
FIG. 4 is a detail diagram illustrating the data organization of a digitized waveform as stored in the waveform table of FIG. 1.

In accordance with U.S. Pat. No. 4,617,645, the waveforms were encoded in the system of Ser. No. 598,892 by storing one four-bit index for each waveform sample (i.e. two indices per byte) in the index bytes 22, and sixteen eight-bit delta values in the sixteen delta table bytes 24. The indices and delta values together defined a waveform as described below.

In the above-described environment, the present invention provides techniques for substantially reducing the memory requirements (typically on a floppy disc) for the tables 10, 12 and 14 while improving the quality of the speech which can be generated by the system of FIG. 1.

1. Optimal-Delta Compression

U.S. Pat. No. 4,617,645 teaches that in a text-to-speech conversion system of the type described in application Ser. No. 598,892; the waveform segments necessary for the construction of speech can be stored in a relatively small amount of memory by using an optimum-delta compression technique related to linear prediction coding. In that technique sixteen discrete increment values Δ are stored in a delta table, and the waveform samples on readout are computed by the formula $$S_t = 2S_{t-1} - S_{t-2} + \Delta \tag{1}$$

where
- $S_t$ = sample to be computed;
- $S_{t-1}$ = next preceding sample;
- $S_{t-2}$ = second preceding sample; and
- $\Delta$ = increment selected from the delta table.

The selection of $\Delta$ is done for each sample by reading a four-bit stored address corresponding to that sample, and using it to fetch the $\Delta$ stored in the delta table at that address. In this manner, each sample can be defined by four stored bits instead of eight—a saving far outweighing the extra sixteen bytes required for the delta table.

The sixteen values of $\Delta$ which will produce the most accurate reproduction of the stored waveform are pre-calculated off-line for each waveform and are stored with it, as detailed in U.S. Pat. No. 4,617,645.

In accordance with the present invention, a considerable further saving of storage space can be obtained by the use of Huffman coding, i.e. a coding method in which addresses are defined by codes having a non-uniform number of bits. For example, in one form of Huffman code, sixteen addresses may be defined by three two-bit codes, six five-bit codes, and seven seven-bit codes, thus:

| Delta Address | ADDRESS CODE (index) |
|---|---|
| 0 | 0 0 |
| 1 | 0 1 |
| 2 | 1 0 |
| 3 | 1 1 0 0 0 |
| 4 | 1 1 0 0 1 |
| 5 | 1 1 0 1 0 |
| 6 | 1 1 0 1 1 |
| 7 | 1 1 1 0 0 |
| 8 | 1 1 1 0 1 |
| 9 | 1 1 1 1 0 0 0 |
| 10 | 1 1 1 1 0 0 1 |
| 11 | 1 1 1 1 0 1 0 |
| 12 | 1 1 1 1 0 1 1 |
| 13 | 1 1 1 1 1 0 0 |
| 14 | 1 1 1 1 1 0 1 |
| 15 | 1 1 1 1 1 1 0 |

Experience has shown that when speech waveforms are encoded in accordance with the teachings of U.S. Pat. No. 4,617,645, a few $\Delta$ values in each delta table are addressed far more frequently than others. Consequently, by selecting the two-bit Huffman codes for the most frequently used values of $\Delta$, most samples can be stored in the form of two-bit addresses. The resulting saving far outweighs the occasional need for using a five-bit or even a seven-bit address for certain samples.

Figure 5:
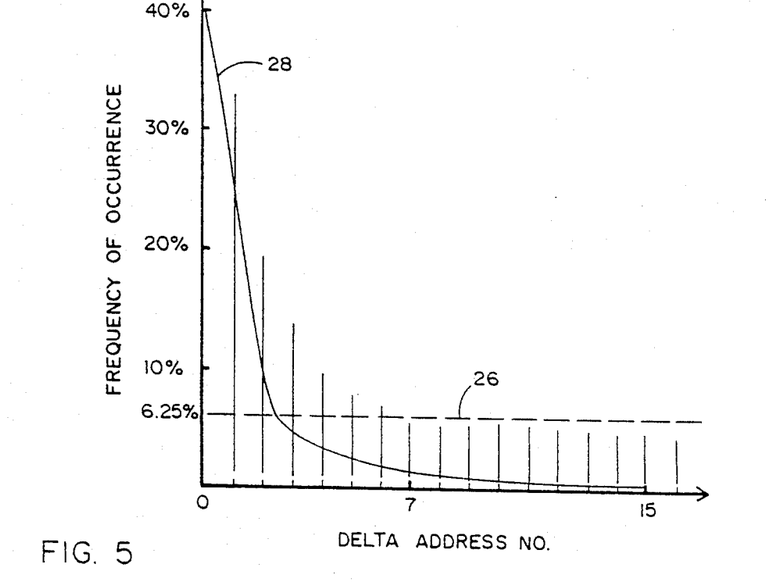
FIG. 5 is a diagram illustrating the applicability of Huffman coding.

FIG. 5 shows the distribution of data addresses which makes the Huffman coding practical. If the distribution is totally uniform (dotted line 26), Huffman coding is detrimental. If the distribution is strongly skewed (solid curve 28), about 75% of all indices might consist of only two bits each, 17% of five bits each, and 8% of seven bits each. A 100-sample waveform with this distribution can thus be encoded with 291 index bits instead of the conventional 400.

2. Compression By Storing Waveform Differences

Figure 6A:
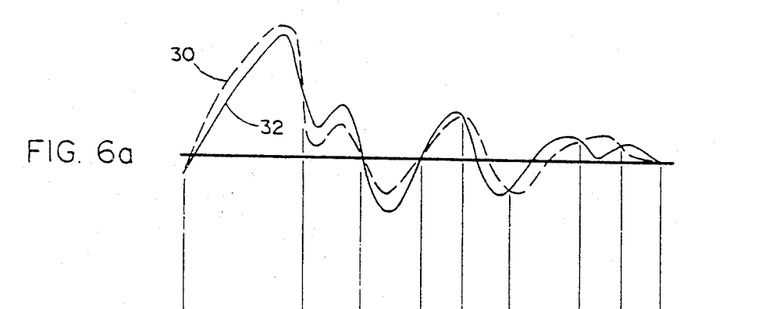
FIG. 6a is a time-amplitude diagram showing a pair of similar waveforms.
Figure 6B:
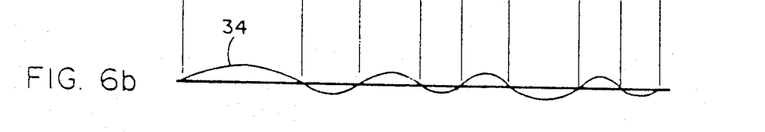

The production of vowel sounds in artificial speech involves the concatenation of a substantial number of waveforms which differ only slightly from one another, as illustrated by waveforms 30, 32 in FIG. 6a. Further compression can therefore be achieved on voiced sounds by storing the sample-by-sample differences (curve 34, FIG. 6b) between two adjacent fundamental-pitch periods of the voiced sound. In the quasi-stationary part of the voiced phoneme, the differences from one pitch period to the next are quite minimal; storing these differences instead of the original samples permits the use of Huffman encodings that are particularly space-efficient because it exacerbates the mal-distribution of deltas. In the routine 16 (FIG. 1), the second waveform is computed by saving the first waveform and adding the differences to it on a sample-by-sample basis.

If the original waveform and the waveform to be computed by this process are of different lengths, the shorter one is assumed, for calculation purposes, to be padded with a sufficient number of terminal zeros to match the length of the longer one. The first waveform used by the first segment block of an instruction list is, of course, encoded directly rather than as a difference. In the instruction string of Ser. No. 598,892, which establishes the order in which the stored waveforms are to be fetched, a flag can be set to indicate whether a given stored waveform is to be read directly or as a difference from the next preceding waveform.

In the use of this compression technique, it is advantageous to pre-compute the demarcation of one pitch period to the next off-line in such a manner as to minimize the average sample-to-sample difference.

3. Multiple Use Of Delta Tables

It has been found in practice that the best-fit delta tables for many successive waveforms used in the generation of a particular sound are either identical or so similar that with minor adjustments, the delta table of the first waveform can be used with one or more of the succeeding waveforms. Consequently, significant compression is achieved by identifying, in the instruction lists of Ser. No. 598,892, the delta table separately from the waveform sample indicia, and by omitting the storage of any delta table for which the delta table of the preceding waveform can be substituted.

How this is done is illustrated in FIGS. 8a through d. In the improved system of this invention, four different kinds of segment blocks 36, 38, 40, 42 are provided in place of the segment block 20 of FIG. 3. The segment block 36, which corresponds most closely to segment block 20, may be identified by a hexadecimal 00 in the first byte. The next three bytes contain the address of the waveform in the waveform table 14, and the fifth byte contains the number of indices in the stored waveform. The sixth byte is the status byte. It contains a three-bit repetition count for repetitive consecutive readouts of the waveform; a voice status bit; an interpolation flag indicating whether or not to interpolate the present waveform with the preceding waveform which has been stored in a buffer (not shown); a difference flag indicating whether the addressed waveform is an original waveform or the difference from the preceding waveform; and a delta table flag indicating whether the stored waveform has its own delta table or whether the delta table of the preceding waveform (stored in a buffer) is to be used. The remaining bit may be used for other control functions.

In the list organization of this invention, successive segment blocks are always stored in sequence. Hence, the next-segment pointer in the block 20 of FIG. 3 is unnecessary.

Figure 8A:
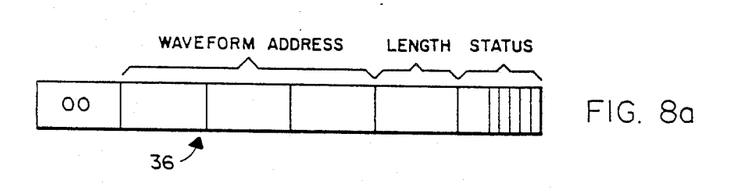
FIG. 8a through 8d are detail block diagrams similar to FIG. 3 but showing the four types of segment blocks used in the invention.
Figure 8B:
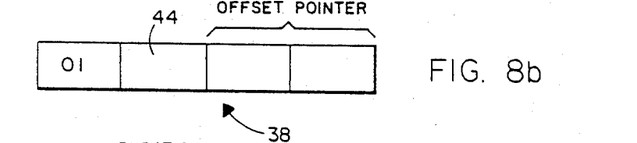
Figure 8C:
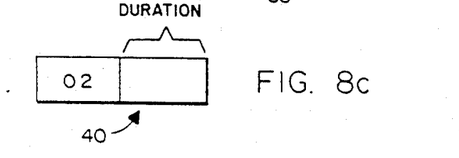
Figure 8D:
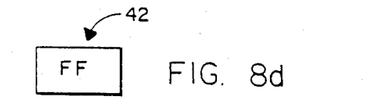

A second type of segment block 38 is illustrated in FIG. 8b. This type of segment block functions as a sublist pointer and is used to access another instruction list (or a trailing portion thereof) as a subroutine. The sublist pointer 38 may be identified by a hexadecimal 01 in the first byte. In the preferred embodiment, the identification byte may be followed by a blank byte 44 (for coding reasons) and a two-byte offset pointer identifying the start of the sublist in the instruction list table.

A third type of segment block 40 is used as a silence block, whose function is discussed in more detail below. Suffice it to say at this point that the silence block may be identified by a hexadecimal 02 in the first byte, and contains the duration of silence (in milliseconds) in the second byte.

The fourth type of segment block 42 is the end-of-list indicator. It simply consists of an identification byte such as hexadecimal FF and returns program control to the point where its instruction list was accessed.

4. Delta Table Positioning

Figure 7:
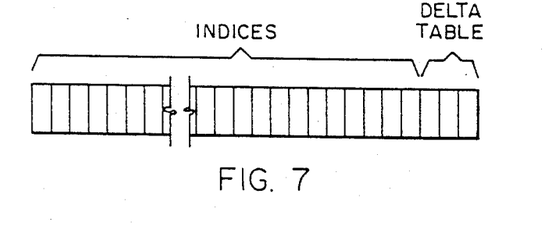
FIG. 7 is a detail diagram similar to FIG. 4 but showing the reorganization of the waveform data in accordance with the invention.

In the compression scheme of U.S. Pat. No. 4,617,645 (FIG. 4), the delta table (which must always be of a known length such as sixteen bytes in order to locate the start of the index bytes) is stored ahead of the index bytes corresponding to the individual samples of the waveform. Further compression can be achieved by storing the delta table after the index bytes as shown in FIG. 7, saving as many bytes as the number of delta addresses never used. If only a total of N delta addresses are ever used to decompress a particular waveform, where N<16, then the method of assigning these delta addresses the values 0 to N−1 and storing only N delta values in the delta table results in a savings of 16−N bytes. For example, if a 128-byte waveform were such that it could be described using only three delta values, then using a combination of the techniques described in sections 1 to 4 of this specification would result in a reduction of the memory space required for storing the waveform from the (16+128 ÷2)=80 bytes achievable prior to the present invention to 128÷4+3)=35 bytes.

The truncation of the delta table presents no danger of misreading an index byte of the next waveform as a Δ value, because the truncation inherently removes from the index bytes all delta addresses higher than the highest address actually used in the delta table.

5. Compromise Waveforms

During the offline process of performing analysis of audio waveforms as described in U.S. Pat. No. 4,617,645, it sometimes becomes apparent that different waveforms have similar spectrum information. If this is the case, a compromise waveform can be calculated which differs little enough from one or more other waveforms to be substitutable for all of them without significant loss of audio quality. Inasmuch as such a substitution reduces the total number of waveforms which need to be stored in a given program, substantial memory savings can be achieved in this manner.

6. Silence As A List Element

Unvoiced stops account for 25–50% of all running speech. Prior to the present invention, unvoiced stops were treated and stored as components of waveforms or waveforms consisting of zero-value samples. In accordance with the present invention, a special segment block 40 (FIG. 8a) is instead inserted into the instruction list defining a particular phoneme or transition. This special silence block does not fetch any waveform, but instead directly generates a string of zero-value samples. The length of the string (in milliseconds) is encoded into the silence block. Considerable economies of waveform storage memory can thus be achieved by storing only active waveforms or portions of waveforms.

7. Speech Table Architecture

In the system of Ser. No. 598,892, the library of instruction lists defining the phonemes and transitions contained P phoneme-defining instruction lists and $P^2$ transition-defining lists so as to provide a transition from every phoneme to every other phoneme. A phoneme table contained pointers to instruction lists used to synthesize the quasi-stationary portion of a phoneme (if it existed), and a transition table contained pointers to instruction lists used to synthesize the rapidly changing sounds in the transition from one phoneme to the next.

Figure 9A:
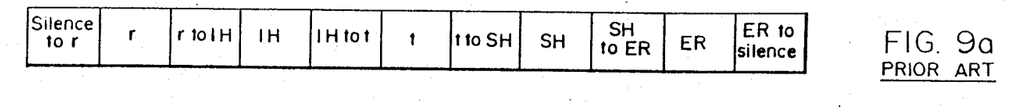
FIG. 9a is a block diagram illustrating the phoneme-and-transition method of organizing speech.

For example, in the synthesis of the word "richer", the two tables were alternately consulted to produce a concatenation of waveforms corresponding to the phonetic code string "rIHtSHER", as shown in FIG. 9a. The phoneme information generally consisted of one segment (e.g. one fundamental pitch period) to be repeated a specified number of times as provided by the segment block. The transition information rarely consisted of more than four segments.

Figure 9B:
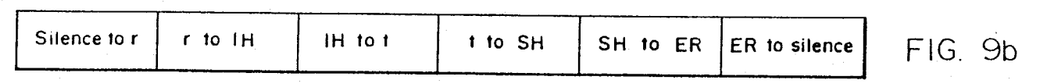
FIG. 9b is a block diagram illustrating the diphone method of organizing speech.

In an attempt to simplify the phoneme/transition table, it was first proposed (FIG. 9b) to extend each transition to the center of the phoneme on each side thereof, and to thereby eliminate the phoneme portion of the table. The resulting extended transitions were termed diphones. Although this scheme saved some memory, no instruction list memory was saved because each diphone was unique.

Figure 9C:
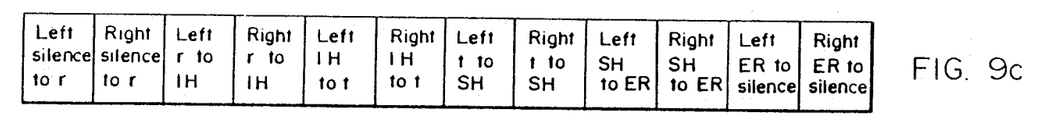
FIG. 9c is a block diagram illustrating the demi-diphone method of organizing speech.

In accordance with the invention (FIG. 9c), diphones can be divided into left and right semi-diphones. The left demi-diphone extends from the mid-point of the previous phoneme to mid-point of the transition into the following phoneme. The right demi-diphone extends from the mid-point of a transition to the mid-point of the following phoneme. It has been found that, unlike the midpoints of phonemes, the mid-points of transitions are not spectrally unique; phonemes can be grouped into "families" based upon the relative compatibility of spectra at the mid-points of transitions. Consequently, left demi-diphones are freely substitutable for other left demi-diphones where the left phonemes are identical and the right phonemes are members of the same right-family; and vice versa. For example, the left demi-diphone in the diphone AE-t is substitutable for that in the diphone AE-d, because t and d are members of the same right-family; similarly, the right demi-diphone in the diphone s-AH is substitutable for that in the diphone t-AH, because s and t are members of the same left-family.

As a result, considerable savings in instruction list memory can be achieved by using the same demi-diphone for several diphones. Therefore, in accordance with the invention, two tables (left and right) of $P^2$ demi-diphones are provided and consulted alternatively by the program. The additional memory required by the second demi-diphone table is far more than compensated for by the reduced number of segment blocks which need to be stored in the instruction list memory.

8. Fricative Sounds

Figure 10A:
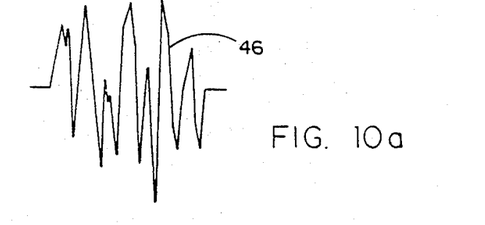
FIG. 10a illustrates a waveform representing a portion of a fricative sound.
Figure 10B:
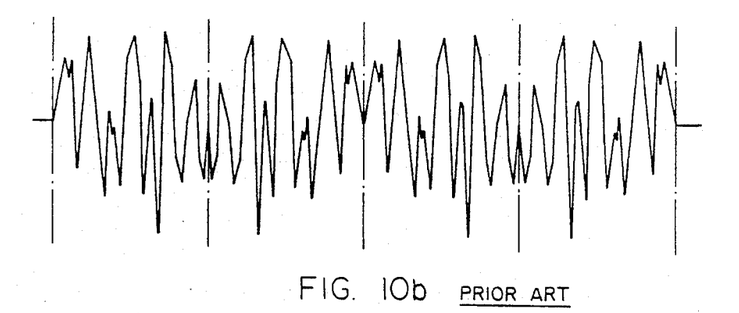
FIG. 10b illustrates a prior art method of concatenating repetitions of the waveform of FIG. 10a to form a fricative sound.

In the system of Ser. No. 598,892, fricative sounds were produced by generating a randomly shaped waveform 46 (FIG. 10a) of S samples alternately forward and backward (FIG. 10b). It was found in practice that this method, although better in quality than prior methods, still generated a slight buzz at a frequency equal to the reciprocal of the stored waveform length. Also, the resulting sound contained abrupt amplitude changes which are not found in natural speech.

In accordance with the invention, the buzz is eliminated by replacing segments containing alternating-direction repetitions of the entire stored waveform with segments containing increasingly truncated repetitions.

The reason for this is that splicing (i.e. concatenating) many segments of a white noise consisting of random numbers of equal distribution (which is the essence of a fricative sound) causes a spurious fundamental frequency to appear at the splice rate, together with its harmonies. However, as long as the segments are different, these spurious frequencies occur at random phases and therefore cancel out. However, repeating a waveform causes the spurious frequencies to have the same phase in successive repeats, and a buzz results. Changing the length of the repetitions by truncation destructively changes the phase of the spurious frequencies, and the buzz disappears.

The progressive truncation of the repetitions is done in accordance with the formula $$s = S \frac{9-i}{8} \quad (2)$$

where
s=number of samples used in a given repetition;
N=total number of samples in waveform; and
i=repetition number.

Figures 10C, 11A:
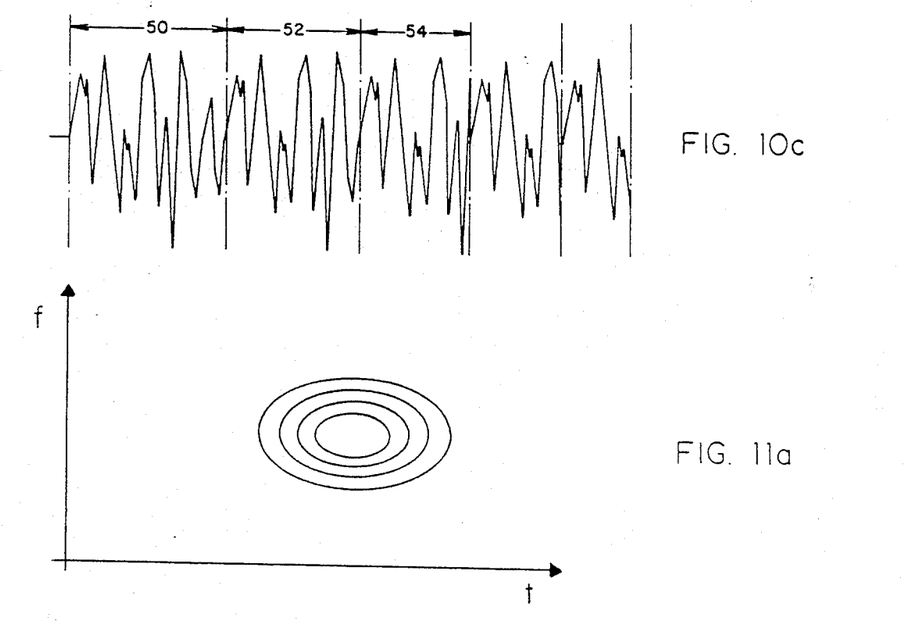
FIG. 10c illustrates a novel method of concatenating repetitions of the waveform of FIG. 10a in accordance with the invention.
FIG. 11a is a time-frequency diagram illustrating the frequency spectrum of a fricative sound.
Figure 11B:
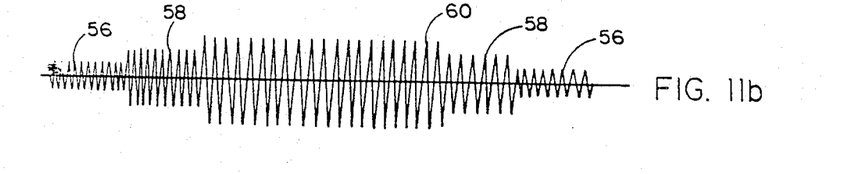
FIG. 11b is a time-amplitude diagram illustrating the construction of a fricative sound from a series of waveforms of different amplitudes.

Thus, the first repetition 50 may use the entire waveform 46; the second repetition 52 only the first seven eighths of the waveform 46; the third repetition 54 only the first six eighths; and so forth. As a practical matter, there are seldom more than three or four repetitions, as a typical fricative requires the use of three or more segments 56, 58, 60 of different amplitudes (FIG. 11b) to reproduce the natural rise and fall of the signal amplitude inherent in the pronunciation of a fricative. Of the segments shown in FIG. 11b, only 60 is long enough to contain a plurality of repetitions. The segments 56, 58 and 60 differ from each other in more than merely amplitude (and therefore cannot be computed from a single waveform 46), because as shown in FIG. 11a, the frequency spectrum of a fricative changes during its pronunciation.

The truncation algorithm is preferably applied to all unvoiced sounds; as most segments in unvoiced sounds are played only once, actual truncation seldom occurs.

9. Harmonic Distortion Reduction

A substantial amount of high-frequency, harmonic distortion is generated any time an abrupt, discontinuous jump in instantaneous voltage occurs in an audio waveform. There are two sources of such discontinuities in the system of Ser. No. 598,892. One is the concatenation of speech segments from different demi-diphones; in general, a randomly-selected waveform will not end at the same level as where another one begins. This problem is exacerbated by the selection of pitch period demarcations for special purposes, as when waveform differences are stored as described in section 2 hereof. The second source is the truncation of samples from the end of a voiced pitch period in order to raise the pitch of a sound. By adding a ramp into the waveform, the discontinuities can be eliminated.

Figure 12A:
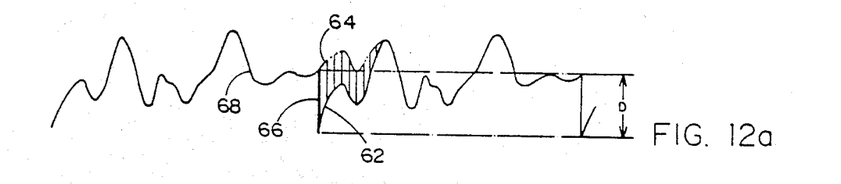
FIG. 12a is a time-amplitude diagram illustrating the ramping of a discontinuous waveform to reduce harmonic distortion.

As shown in FIG. 12a, this rapping is accomplished as follows: Before computing any waveform from the stored indices, the first sample of the new waveform is algebraically subtracted from the last sample of the preceding waveform. If the difference is positive, each sample of the new waveform 62 is increased by $$I = D - ni \quad (3)$$

where
I=increase of a given sample;
D=difference between first and last previous sample;
n=sample number; and
i=predetermined increment, to form an altered new waveform 64 which does not have a discontinuity at its junction 66 with the old waveform 68. When I reached 0, no further modification of the new waveform samples is performed. If D is negative, i is also negative, and the new waveform samples are decreased by I.

Figure 12B:
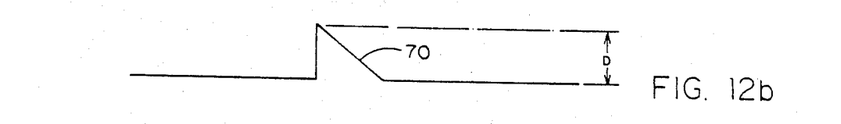
FIGS. 12b through d are time-amplitude diagrams illustrating various types of ramping signals.
Figures 12C, 12D:
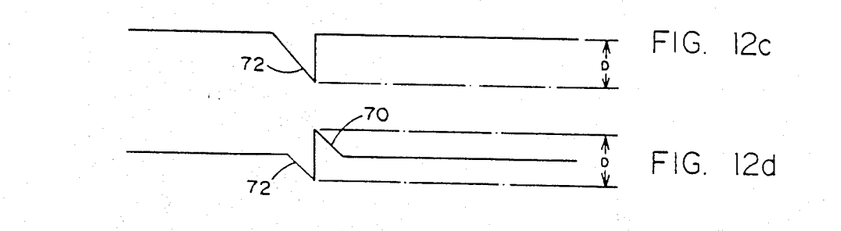

Although the method described above involves the ramping of the beginning of a waveform by adding the ramping signal 70 of FIG. 12b, the same procedure (in reverse) can be used to ramp the end of a waveform by adding thereto the ramping signal 72 of FIG. 12c, or a combination of both can be used as shown in FIG. 12d.

10(a). Speed Control

In order to simulate the natural stress patterns of ordinary speech, a synthesizer must be able to lengthen and shorten the duration of individual phonemes. Also, by lengthening or shortening all phonemes as a group, the user is able to establish a comfortable overall speed level for speech output. In addition, in the system of Ser. No. 598,892, it is necessary, in order to maintain a constant speed, to compensate automatically for the effect of pitch changes. The system of Ser. No. 598,892 lengthens or shortens the wavelengths of individual pitch periods to bring about changes in the fundamental frequency (pitch), which has a global effect of lengthening or shortening phoneme duration.

The stored waveforms in the system of Ser. No. 598,842 are all about the same length, i.e. the wavelength of the average fundamental pitch frequency of an average human voice. Therefore, if a typical human pitch frequency is 400 Hz, the system of Ser. No. 598,892 will produce about 400 waveforms per second. These waveforms are concatenated into segments which may contain anywhere from 1 to 5 repetitions of the same waveform, as determined by the repetition count stored in the segment block.

In accordance with the present invention, the speed of the speech can be slowed, or a demi-diphone lengthened, without affecting the pitch (or, conversely, the pitch can be raised without affecting the speed) by providing an adjustable waveform counter 80 (FIG. 13a) which causes every cth waveform to be repeated, resulting in speech which is slower by a factor of $(c+1)/n$. The value of c is dynamically controlled by the prosody evaluator and by the speed and pitch controls of the system of Ser. No. 598,892.

Figure 13A:
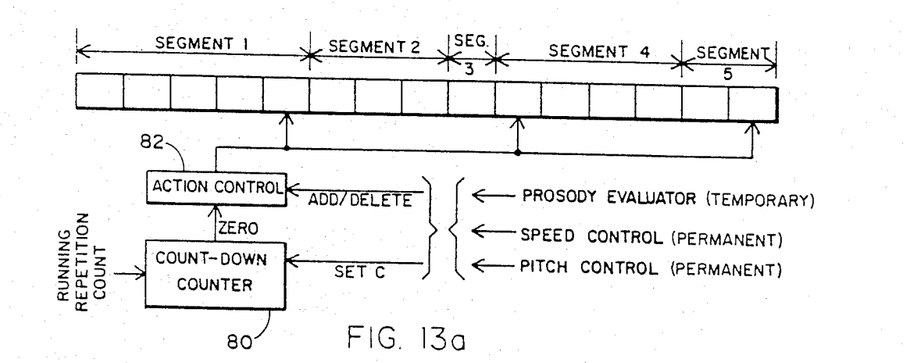
FIG. 13a is a block diagram illustrating a speed control system according to the invention.

Similarly, the speech can be speeded up, an individual demi-diphone can be shortened, or the pitch can be lowered without affecting the speech, by deleting every cth waveform. Within wide limits, the repetition or deletion of a single waveform in a series of waveforms causes no significant deterioration in the quality of the speech because the spectra of adjacent segments are usually quite close.

As shown in FIG. 13a, the extra repetition or deletion of a waveform is best accomplished by sequentially counting each repetition of each waveform as the instruction list progresses through its segments. The individual repetition count of each consecutive segment is stored in a buffer (not shown). Each time the count-down counter 80 hits zero (and resets to c), the action control 82 either repeats or deletes (depending upon the prosody, speed and pitch inputs) every cth repetition.

Figure 13B:
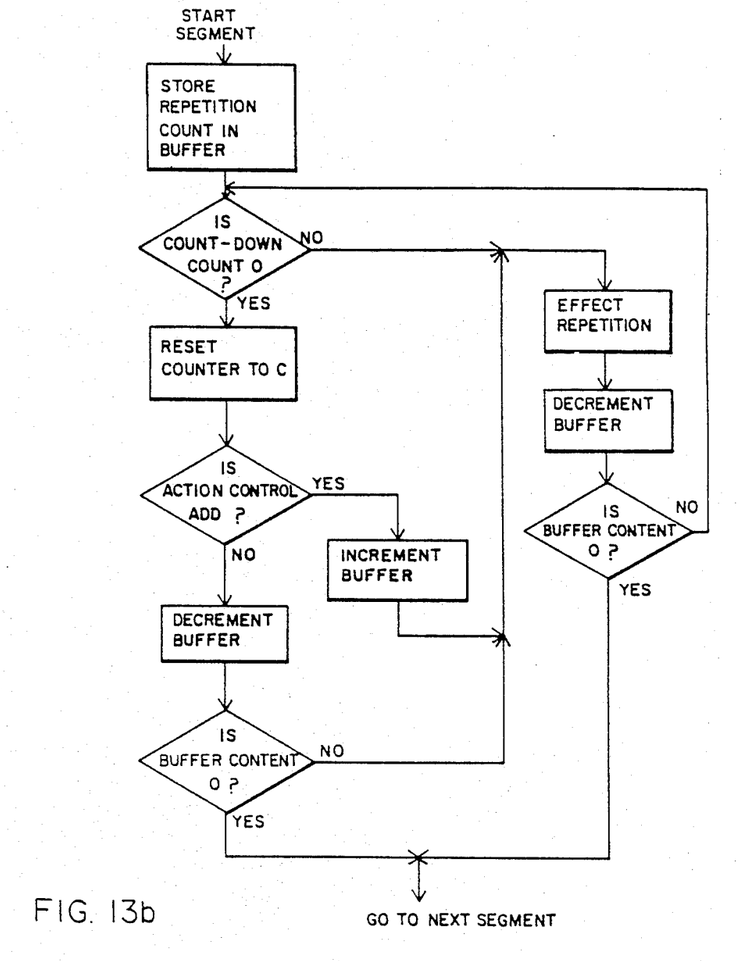

How this is done is illustrates in FIG. 13b. The repetition count buffer is incremented or decremented each time the count-down counter 80 hits zero. An incrementation will cause the segment to be repeated one more time than it otherwise would; a decrementation from an original repeat count of 1 will cause the segment to be omitted, while a decrementation from any higher repeat count will cause the segment to be repeated one less time than normal.

Figure 15:
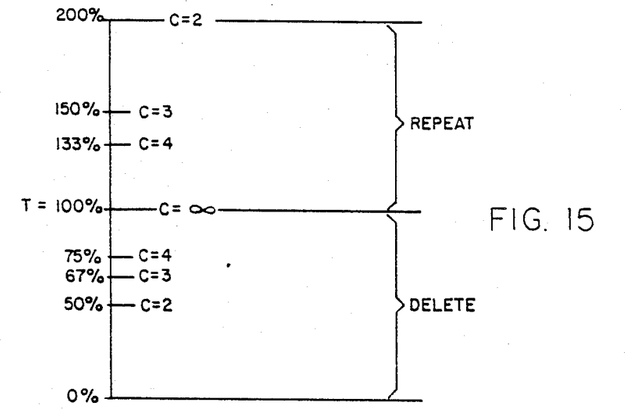

The speed control which can be accomplished by the apparatus of FIG. 13a is quite substantial. If c=00 (actually, the action control 82 turned off) is taken as the norm, at which a given sentence is spoken in T seconds (FIG. 15), then setting c to 2 and the action control to "delete" will result in the sentence being spoken in 50% of T seconds. This requires every other repetition to be deleted—a requirement which has surprisingly little effect on speech quality in practice.

Conversely, setting c to 2 and the action control to "repeat" causes every repetition to be repeated, so that the sentence is spoken in 200% of T seconds. With c=3, the sentence is spoken in 150% of T.

Intermediate values such as 175% T can be readily obtained by alternating c between 2 and 3 on successive countdowns.

10(b). Adaptation Of Interpolation Contour To Speed

Figure 14A:
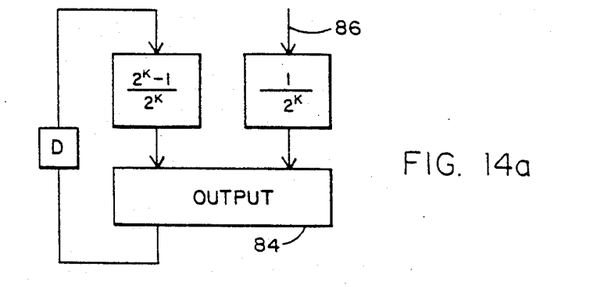

The system of Ser. No. 598,892 advantageously uses interpolation to smooth out the interface between successive instruction lists. This interpolation is typically done by a recursive interpolation circuit illustrated in FIG. 14a, in which D represents a one-sample delay so that the output 84 consists of the sum of the input 86 multiplied by $\frac{1}{2^k}$, where k is a non-negative integer, and of the previous output multiplied by $(2^k-1)/2^k$. If k=2 (the usual case), this results in an interpolation by quarters. If k=0, there is no interpolation.

Figure 14B:
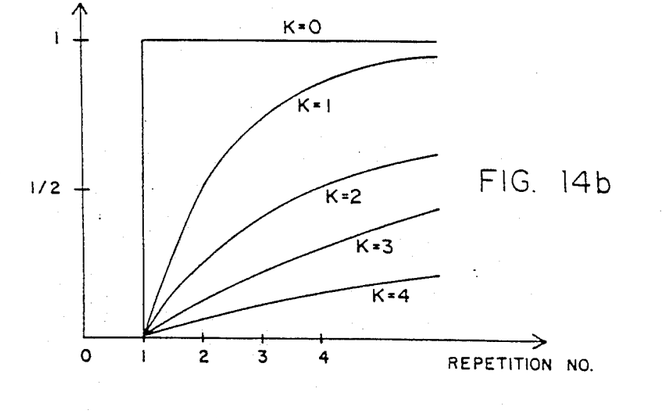

FIG. 14b shows the rise of the interpolates signal when a signal of 0 is followed by a signal of 1, for various values of k. Except for k=0, where the signal instantly goes to its new level, the signal always approaches the new value asymptotically at a rate determined by the value of k.

Figure 14C:
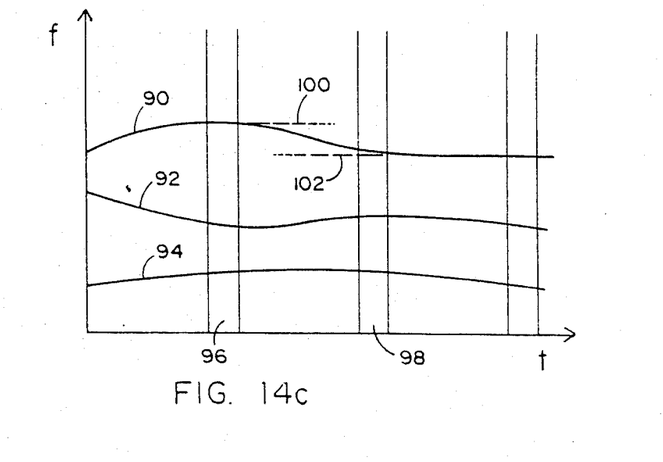

In the generation of vowels, the rising and falling of the various formant frequencies 90,92, 94 (FIG. 14c) between the initial repetitions 96, 98 of adjacent segments is generated by the gradual dying out of the level of repetition 96 (line 100) and the gradual increase in importance of the level of repetition 98 (line 102).

When the speed of speech is increased by deleting a repetition, formant positions change more rapidly, and there is a tendency for the interpolation algorithm to "slur" formant frequencies across several segments. This is compensated for by temporarily reducing k to 1 for one waveform repetition following the deletion to bring about a temporary interpolation by halves (i.e. speeding up the interpolation). Similarly, when the speed of speech is decreased by adding a repetition, k may be temporarily increased to 3 or 4 for one repetition, bringing about a temporary interpolation by eighths or by sixteenths. For very fast speech, interpolation can be turned off entirely by reducing k to zero (FIG. 14b).

Figure 16:
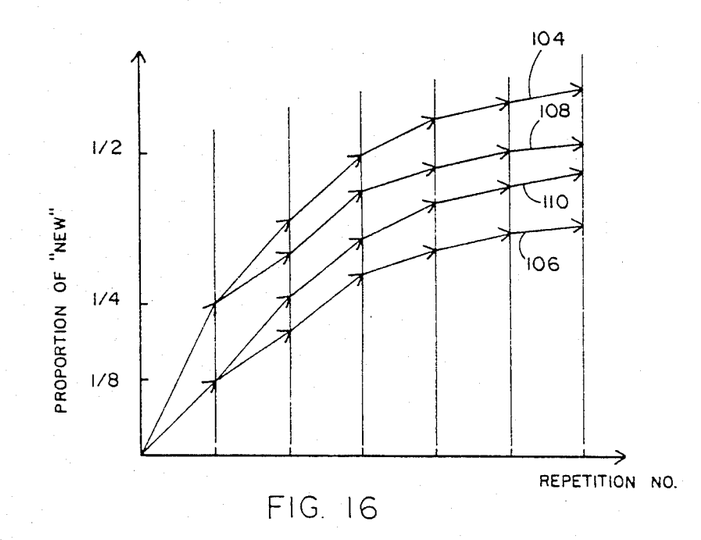

FIG. 16 illustrates the adjustment of interpolation to situations involving the use of alternating values of c in the system of FIG. 13a. For example, just as intermediate speeds can be obtained by alternating c between two values, intermediate interpolation can be obtained by alternating the value of k for successive repetitions in the circuit of FIG. 14a. In FIG. 16, curve 104 represents the proportion of the new input value 86 in the output 84 for successive repetitions with k set at 2; curve 106 represents the same proportion with k set at 3; curve 108 represents the proportion with k alternating between 2 and 3, beginning with 2; and curve 110 represents the proportion with k also alternating between 2 and 3 but starting with 3.

It will be seen that by alternating the values of c and k, fine tuning of speed and in-erpolation to match speed can be readily achieved.

SUMMARY

The present invention, when used together with the teachings of U.S. Pat. No. 4,617,645 and application Ser. No. 598,892, provides a highly efficient text-to-speech conversion system capable of producing high-quality speech at selectable speeds and pitches with a minimum amount of memory.

I claim:

1. In a method of digitally converting text to speech, said method including the step of encoding waveforms representing sounds in the form of digital indices representing addresses in a table containing selected values of $\Delta$, and the successive samples of the waveform are computed by the formula $$S_t = aS_{t-1} + bS_{t-2} + \Delta$$

where $S_t$ is the sample being computed, $S_{t-1}$ is the next preceding sample, $S_{t-2}$ is the second preceding sample, a and b are constants, and $\Delta$ is the value stored in said table at the address defined by the index corresponding to $S_t$, the improvement comprising encoding said indices by a Huffman coding in which the shortest codes of said Huffman coding represent the addresses of the $\Delta$ values occurring most frequently in the computation of said waveform.

2. The improvement of claim 1, in which said table is stored in system memory immediately following said indices.

3. The improvement of claim 2, in which said table contains less than the maximum number of Δ values that can be addressed by said indices.

4. In a real-time text-to-speech conversion system in which waveforms are encoded in the form of digital indices representing addresses in a table containing selected values of Δ, and the successive samples of the waveform are computed by the formula $$S_t = aS_{t-1} + bS_{t-2} + \Delta$$

where $S_t$ is the sample being computed, $S_{t-1}$ is the next preceding sample, $S_{t-2}$ is the second preceding sample, a and b are constants, and Δ is the value stored in said table at the address defined by the index corresponding to $S_t$, the improvement comprising:
 (a) encoding successive waveforms so that each $S_t$ represents the difference between the corresponding waveform sample and the corresponding sample of a preceding waveform; and
 (b) adding each $S_t$ to the corresponding sample of said preceding waveform to form the corresponding sample of the waveform being computed.

5. The improvement of claim 4, in which, when said preceding waveform and said waveform being computed have different numbers of samples, the shorter waveform is treated in the computation as if it were padded with sufficient zero value samples to equal the number of samples in the longer waveform.

6. In a real-time text-to-speech conversion system in which waveforms are encoded in the form of digital indices representing addresses in a table containing selected values of Δ, and the successive samples of the waveform are computed by the formula $$S_t = aS_{t-1} + bS_{t-2} + \Delta$$

$S_t$ is the sample being computed, $S_{t-1}$ is the next preceding sample, $S_{t-2}$ is the second preceding sample, a and b are constants, and Δ is the value stored in said table at the address defined by the index corresponding to $S_t$, the improvement comprising providing a single table for a plurality of waveforms, said single table being addressable by the indices of each waveform.

7. In a real-time text-to-speech conversion system in which waveforms are encoded in the form of digital indices representing addresses in a table containing selected values of Δ, and the successive samples of the waveform are computed by the formula $$S_t = aS_{t-1} + bS_{t-2} + \Delta$$

where $S_t$ is the sample being computed, $S_{t-1}$ is the next preceding sample, $S_{t-2}$ is the second preceding sample, a and b are constants, and Δ is the value stored in said table at the address defined by the index corresponding to $S_t$, the improvement comprising encoding, in place of a plurality of different actual waveforms, a single compromise waveform precomputed off-line to contain the fewest possible differences from each of said plurality of waveforms.

8. In a method of digitally converting text to speech, said method including the step of producing fricative sounds by concatenating a plurality of segments each containing a plurality of repetitions of a digitally encoded waveform, the improvement comprising the step of increasingly truncating said waveform for each of said repetitions in any given segment.

9. The improvement of claim 8, in which the number n of samples in the i'th repetition of a waveform containing N samples is $$n = N \frac{9 - i}{8}.$$

10. In a method of digitally converting text to speech, said method including the step of producing fricative sounds by concatenating a plurality of segments each containing a plurality of repetitions of a digitally encoded waveform, said segments containing different amplitudes of said waveform, the improvement comprising the step of progressively interpolating the waveform of one of said segments with the waveform of an adjacent segment.

11. In a method of digitally converting text to speech, said method including the step of producing speech by concatenating a plurality of segments each containing at least one concatenated repetation of a stored digitally encoded waveform, a method of varying the speed of the speech comprising the steps of:
 (a) reiteratively counting said concatenated waveform repetitions;
 (b) deleting or repeating one of said waveform repetitions when said count reaches a selectable number; and
 (c) varying said number.

12. The method of claim 11, in which said segments are defined by segments blocks containing an index representing the number of waveform repetitions in the segment, and said index is temporarily incremented or decremented whenever said count reaches said selectable number.

13. The method of claim 12, in which said segment is omitted when said index becomes other than a positive integer as a result of being decremented.

14. In a method of digitally converting text to speech, said method including the step of producing speech by concatenating a plurality of segments each containing at least one concatenated repetition of a stored digitally encoded waveform, and in which the waveforms of predetermined successive segments are interpolated in accordance with the formula $$S_{t\ out} = \frac{S_{t\ in} + S_{t-1\ out}(2^k - 1)}{2^k}$$

where
 $S_t$ out is the output signal for a given sample;
 $S_t$ in is the input signal for that sample;
 $S_{t-1\ out}$ is the output signal for the previous sample; and
 k is a non-negative integer,
a method of preventing the slurring of formants comprising the step of varying the value of k in accordance with the speed of the speech.

15. The method of claim 14, in which the value of k is 2 for normal speech, 1 for accelerated speech, and 3 or 4 for slowed speech.

16. The method of claim 14, in which the interpolation of said waveforms is selectively disabled by making k equal to zero.

* * * * *